United States Patent
Swarztrauber et al.

(10) Patent No.: US 9,933,465 B2
(45) Date of Patent: Apr. 3, 2018

(54) LOCAL TRANSFORMER LEVEL GRID MANAGEMENT SYSTEMS AND METHODS

(71) Applicant: Quadlogic Controls Corporation, Long Island City, NY (US)

(72) Inventors: Sayre Swarztrauber, New York, NY (US); Doron Shafrir, Suffern, NY (US)

(73) Assignee: QUADLOGIC CONTROLS CORPORATION, Long Island City, NY (US)

( * ) Notice: Subject to any disclaimer, the term of this patent is extended or adjusted under 35 U.S.C. 154(b) by 164 days.

(21) Appl. No.: 15/008,567

(22) Filed: Jan. 28, 2016

(65) Prior Publication Data
US 2016/0216299 A1    Jul. 28, 2016

Related U.S. Application Data

(63) Continuation of application No. 13/489,922, filed on Jun. 6, 2012, now Pat. No. 9,255,949.

(60) Provisional application No. 61/495,437, filed on Jun. 10, 2011.

(51) Int. Cl.
| | |
|---|---|
| *G01R 22/10* | (2006.01) |
| *G01R 22/06* | (2006.01) |
| *H02J 3/00* | (2006.01) |
| *G01R 31/02* | (2006.01) |

(52) U.S. Cl.
CPC .......... *G01R 22/10* (2013.01); *G01R 22/063* (2013.01); *G01R 22/066* (2013.01); *H02J 3/00* (2013.01); *G01R 31/027* (2013.01)

(58) Field of Classification Search
CPC .................. G01R 22/10; H02J 3/00

USPC ............................................ 307/39; 324/105
See application file for complete search history.

(56) References Cited

U.S. PATENT DOCUMENTS

| | | | | |
|---|---|---|---|---|
| 3,821,605 | A * | 6/1974 | Pendrak ................ | H01F 27/402 340/646 |
| 4,337,401 | A * | 6/1982 | Olson ................ | G05D 23/1934 307/39 |
| 4,654,806 | A * | 3/1987 | Poyser ..................... | H02H 7/04 324/726 |
| 4,749,992 | A * | 6/1988 | Fitzemeyer ............ | G01D 4/004 340/12.32 |

(Continued)

*Primary Examiner* — Rexford Barnie
*Assistant Examiner* — Joseph Inge
(74) *Attorney, Agent, or Firm* — Steven D. Underwood; FisherBroyles LLP

(57) ABSTRACT

A remotely readable apparatus for metering of a plurality of electricity consumer lines, comprising: (a) a meter head that measures electricity usage for each of the plurality of electricity consumer lines; and (b) sensors that sense environmental conditions in a second housing enclosing a distribution transformer that steps down voltage from a distribution level to a consumer level, said one sensors in communication with said meter head and not operable to sense environmental conditions in said first housing, and wherein said meter head connects and disconnects service on said plurality of electricity consumer lines in response to information received from said sensors; wherein a transponder transmits data received to/from said meter head to/from a remotely located computer, and said meter head is operable, based on data received from said transponder, to connect/disconnect service on said electricity consumer lines.

11 Claims, 15 Drawing Sheets

(56) References Cited

U.S. PATENT DOCUMENTS

| | | | | |
|---|---|---|---|---|
| 6,667,438 B2* | 12/2003 | Schneider | ............... | H02B 7/06 |
| | | | | 16/221 |
| 2006/0066456 A1* | 3/2006 | Jonker | ................ | G01R 21/133 |
| | | | | 340/870.02 |
| 2007/0150237 A1* | 6/2007 | Swarztrauber | ......... | G01D 4/002 |
| | | | | 702/188 |
| 2011/0208366 A1* | 8/2011 | Taft | .................. | H04L 29/08846 |
| | | | | 700/295 |

* cited by examiner

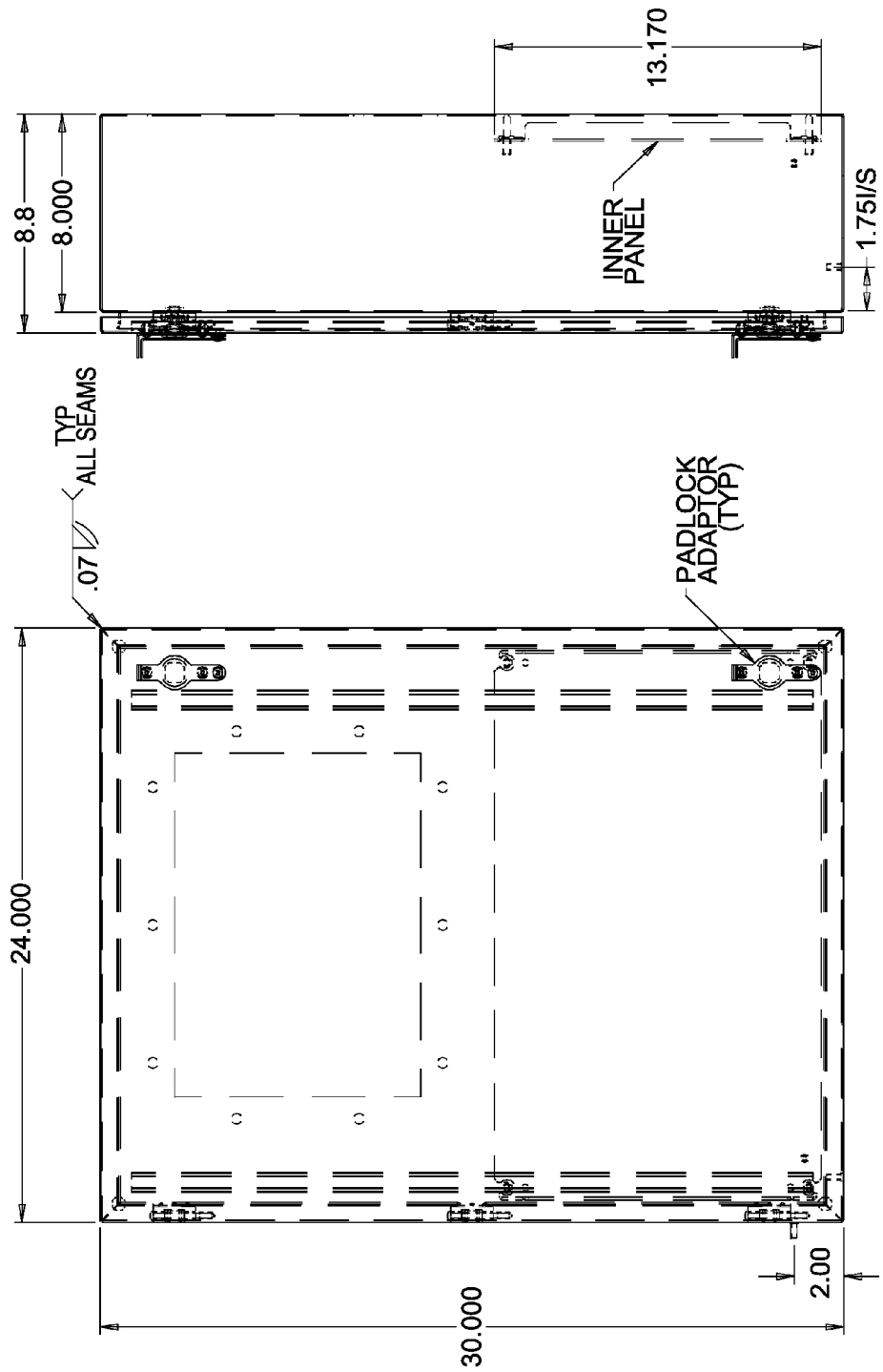

ISOMETRIC VIEWS

BACK VIEW

BOTTOM VIEW (TYP) DETAIL A

LOCAL TRANSFORMER LEVEL GRID MANAGEMENT SYSTEMS AND METHODS

CROSS-REFERENCE TO RELATED APPLICATIONS

This application claims priority to U.S. Provisional Patent Application No. 61/495,437, filed Jun. 10, 2011, and to U.S. patent application Ser. No. 13/489,922, filed Jun. 6, 2012, both with the above title. The entire contents of the above-referenced applications are incorporated herein by reference.

INTRODUCTION

One or more exemplary embodiments relate to management of an electrical distribution system at the local transformer and metering level. In particular, these embodiments relate to advanced features of a distributed remotely-readable electricity metering system including monitoring and control of a transformer's electrical and physical state and its loads.

For example, the last leg of an electrical distribution system typically involves a medium tension (from 11 kV to 35 kV) feeder connected to one or more distribution transformers that step the voltage down to the end-user level of 120-480 volts. In turn, the outputs of each of these transformers are connected to end-user residences or businesses.

In the past, low-voltage wires often exited the transformer and ran from pole to pole, creating a low voltage network for connection to each house or business, finally entering the meter and then the building electrical panel. End-user electricity theft typically occurs when end-users make unauthorized connections to the low-voltage network between the secondary of the transformer and the meter. As long as such low-voltage attachment points exist, such theft remains difficult to avoid. One solution involves minimizing or eliminating altogether any exposed un-metered low-voltage conductor between the transformer secondary and the meter, leaving no place for the would-be thief to connect. The practicality of this approach is complicated by the need to keep the electricity meter accessible to meter reading personnel. Moreover, even if the low-voltage conductor could be fortified or protected in some way from illicit connection, the further problem of meter tampering remains.

Automated Meter Reading ("AMR") systems are known. An exemplary AMR system is described in U.S. Pat. No. 7,596,459, the contents of which are incorporated herein by reference. Also see Exhibit 4 of U.S. Provisional Application No. 61/495,437. Because AMR meters are remotely readable, they are not required to be within easy access or view of meter readers, and therefore may be located on the pole, near the transformer. An example of such a system is Quadlogic Control Corporation's Energy Guard™ (see, for example, www.quadlogic.com/productsEG.html).

One or more exemplary embodiments are directed at improving an Energy Guard type of anti-theft remote metering and disconnect system via implementation of novel transformer and utility system management elements.

One or more exemplary embodiments have a meter box (a box containing the metering devices) either adjacent to or integrated with the transformer case itself, and thus beyond safe or practical access of thieves. With an embodiment comprising the metering system and transformer integrated within a shared secure metal case with anti-tampering features, there remains no exposed un-metered attachment point for electricity theft. Dangerous and impossible-to-tap medium tension power enters the box (i.e., the enclosure containing both the transformer and the distributed metering devices) and low-voltage metered power exits.

In one or more exemplary embodiments, in addition to containing the transformer and a multi-point metering array, certain advanced AMR systems include remotely operable cutoff relays within the same case. In cases of theft, tampering, or non-payment, for example, the power authority can remotely disconnect and, upon resolution, remotely reconnect power to individual customers.

Distribution transformers often are constructed as sealed metal "cans." Since, under load conditions, the internal wire windings may become quite hot, the can typically is filled with electrically-insulating but heat-conducting oil to dissipate the heat. This oil is critical to the proper and efficient operation of such transformers.

Various conditions may cause a transformer to overheat and become inefficient. Examples include: (a) if the oil level becomes low (e.g., the can leaks); or (b) if the electrical load is too high. Indeed, if the oil level is too low, the transformer itself may "blow" before its protective fuse does—an expensive and dangerous consequence.

Various devices exist to detect transformer overheating conditions from the ground (visible "pop-up" indicators, etc.) and at the higher system level of electrical substations, so-called SCADA systems (supervisory control and data acquisition) for monitoring large transformers are well-known but remain expensive. A remote "early-warning" system has been desirable, but has remained impractical at the local transformer level. One or more exemplary embodiments provide novel systems and methods for acquiring and acting locally upon information acquired concerning the state of the transformer.

The same environments in which electricity theft flourishes are also usually the settings for frequent black-outs and brown-outs. In fact, due to that very theft, many transformers become overloaded, having been designed for fewer customers and lighter, properly-balanced loads. Moreover, frequent power restorations result in power surges that can strain system elements and create secondary failures of equipment, including transformers and switches. With high-level SCADA systems, the solution is the simple disconnection and reconnection of an entire branch or feeder. One or more exemplary embodiments make possible much more selective disconnection and reconnection of transformer loads at the end-user level.

One or more exemplary embodiments include means for metering the output phases of the transformer separately from the individual end-user loads. This feature provides: (a) a further "fail-safe" against theft by providing a check-sum to compare with the total of the readings of the end-user meters; (b) a means to read transformer phases individually to detect phase use imbalance, which can lead to overload; and (c) to map phase information for each meter.

One or more exemplary embodiments provide implementation of systems and methods for intelligent, safe, efficient, and distributed management of individual loads at the end of the chain, at the transformer level, in the power-down and power-up process.

One or more exemplary embodiments relate to an "Energy Guard" type of remotely readable AMR system (see, for example, U.S. Pat. No. 7,596,459) with disconnect relays and novel anti-theft and grid management and protection features and functions. Exemplary embodiments may comprise one or more of the following features and functions:

1. An integral "master" metering element to compare independently measured total transformer load to a sum of measured customer loads of the multi-meter array in order to detect theft, identify loads by phase and, where needed, map individual meters to each phase. See U.S. Pat. No. 7,596,459 (esp. columns 9 and 10, and the claims). The relays may be "latch-in" devices that require no power to maintain their state.

2. Brown-outs/black-outs. In case of power-down, a battery backup system (or equivalent), after loss of system power, allows for disconnecting all (or selected) relays in preparation for orderly power restoration. Optionally, the current state of each of the relays (e.g., which ones are at that moment disconnected and which are connected) may be recorded. In other cases, the states may have been recorded previously during routine operation.

3. Upon power-up, (with all loads already disconnected from the transformer) the cutoff relays are used for the purpose of orderly load restoration management and grid protection, restoring relays to their previous (just prior to power-down) state with or without communication and control from the head-end.

4. Restoring relays in an orderly sequential manner to avoid surges and excessive load on the substation network.

5. If power remains unsteady, performing a rotating connect/disconnect to provide at least intermittent power to customers.

6. Performing (4) or (5) using previously locally stored relay state information with or without immediate communication with the head-end, under local, pre-programmed control.

7. On detection of dangerously unbalanced transformer phase loads, perform targeted disconnect of unbalanced loads, with or without communications with a remotely located computer ("head-end communication").

8. On detection of high transformer temperature or low oil level, report such conditions to a head-end and/or perform pre-programmed disconnect of all loads or, if unbalanced, only the overloaded phases (with or without head-end communication).

9. A capacitor bypass to allow direct PLC communication around the transformer.

At least one exemplary aspect comprises an apparatus for multi-channel metering of electricity, comprising: (a) a meter head that comprises one or more metering points, the meter head operable to connect and disconnect service on each one of a plurality of electricity consumer lines, and the meter head operable to measure electricity usage for each of the plurality of electricity consumer lines; and (b) a housing containing the meter head and a distribution transformer.

In one or more exemplary embodiments: (1) a transponder is in communication via power line communication with the meter head and operable to transmit data received from the meter head to a remotely located computer, and to transmit to the meter head via power line communication data received from the remotely located computer; (2) the distribution transformer converts medium tension distribution voltages to low tension voltages appropriate for supplying power to customers, and wherein the apparatus is operable to inject signals onto and receive signals from power lines; the signals providing two-way communication between the meter head and the transponder and traversing the distribution transformer; (3) the housing comprises two units welded together; (4) the housing comprises two units bolted together; (5) the housing comprises two integrated units; and/or (6) the housing comprises two units connected via a metal collar.

At least one exemplary aspect comprises an apparatus for multi-channel metering of electricity, comprising: (a) a meter head that comprises one or more metering points, the meter head operable to connect and disconnect service on each one of a plurality of electricity consumer lines, and the meter head operable to measure electricity usage for each of the plurality of electricity consumer lines; and (b) one or more sensors operable to sense environmental conditions in a distribution transformer housing, the one or more sensors in communication with the meter head.

In one or more exemplary embodiments: (1) the one or more sensors comprise a temperature sensor operable to measure temperature of the distribution transformer, and the meter head is in communication with the temperature sensor; (2) the one or more sensors comprise an oil-level sensor operable to measure level of oil in the distribution transformer, and the meter head is in communication with the oil-level sensor; (3) the meter head is, in response to data received from the temperature sensor, operable to connect/disconnect service on one or more of the electricity consumer lines; (4) a transponder is in communication via power line communication with the meter head and operable to transmit data received from the meter head to a remotely located computer, and to transmit to the meter head via power line communication data received from the remotely located computer; and the meter head is operable to transmit to the transponder data based on the data received from the temperature sensor, and the meter head is operable, based on data received from the transponder and responsive to the data based on the data received from the temperature sensor, to connect/disconnect service on the electricity consumer lines; (5) the meter head is, in response to data received from the one or more sensors, operable to connect/disconnect service on the electricity consumer lines; and/or (6) a transponder is in communication via power line communication with the meter head and operable to transmit data received from the meter head to a remotely located computer, and to transmit to the meter head via power line communication data received from the remotely located computer; and the meter head is operable to transmit to the transponder data based on the data received from the oil-level sensor, and the meter head is operable, based on data received from the transponder and responsive to the data based on the data received from the oil-level sensor, to connect/disconnect service on the electricity consumer lines.

At least one exemplary aspect comprises an apparatus for multi-channel metering of electricity, comprising a meter head that comprises one or more metering points, the meter head operable to connect and disconnect service on each one of a plurality of electricity consumer lines, and the meter head operable to measure electricity usage for each of the plurality of electricity consumer lines; and wherein the meter head is operable, in response to an interruption in flow of electricity being received from a distribution transformer, to actuate corresponding relays to disconnect service on one or more of the electricity consumer lines.

In one or more exemplary embodiments: (1) power to actuate the corresponding relays is stored in and received from a battery back-up system; (2) power to actuate the corresponding relays is stored in and received from a capacitive storage system; (3) the meter head is operable, in response to restoration of electricity being received from a distribution transformer, to actuate corresponding relays to re-connect service on the electricity consumer lines; (4) the meter head is operable to store data reflecting, for each relay, a state existing immediately prior to interruption of electricity flow, and the meter head is operable to actuate corresponding relays to re-connect service on the electricity consumer lines so as to restore each of the relays to the state existing immediately prior to interruption of electricity flow; and/or (5) in response to restoration of electricity being received from a distribution transformer, the meter head is operable to actuate corresponding relays to re-connect service on the electricity consumer lines, the actuation being in a sequence selected to minimize a surge or excessive load on a substation network.

A more detailed description of these and other exemplary aspects and embodiments is provided below.

BRIEF DESCRIPTION OF THE DRAWINGS

FIGS. 11A-11G depict exemplary mechanical drawings of an Energy Guard rectangular cabinet with rear access for attachment to a transformer.

DETAILED DESCRIPTION OF SELECT EXEMPLARY EMBODIMENTS

Exemplary Battery Back-Up Implementation:

In an exemplary battery back-up system, an empty meter slot may be used to store a rechargeable battery. Battery back-up systems are well-known in the art, so all technical details need not be described herein. Those skilled in the art will understand that the system may have a connection to the battery in order to charge the battery, and the system may comprise a step-down transformer and AC-DC converter.

In exemplary embodiments, the system may further comprise a connection from the battery to the metering system, in order to provide power to the meters and control module so that the relays can be disconnected. In an exemplary embodiment, the disconnect/reconnect logic primarily resides in the control module, but there may be some basic logic in the battery back-up system that allows it to detect loss of power and send power to the metering system.

Embodiments described herein, as will be understood by those skilled in the art, are not limited to any particular battery or type of battery. One example of a battery that may be suitable, depending on the particular implementation and environment, is the Tenergy Li-Ion 18650 Pack 14.8V 2200 mAh with PCB (Item No: 31021) (see Exhibit 2 of U.S. Provisional Application No. 61/495,437). Many standard rechargeable batteries have a functioning temperature range from −20° C. to 60° C., and custom batteries may be designed to function down to −40° C. min or up to 80° C. max. NiCd batteries are another option to Li-Ion (they're less expensive and have a similar shelf life but are heavier and larger)—but again, embodiments are not limited to any particular type of battery.

Moreover, those skilled in the art will appreciate that other embodiments may use one or more capacitors, instead of a battery, to support a power-down routine that comprises actuating relays to disconnect load upon loss of power. Any suitable power storage mechanism that provides sufficient power to actuate the relays in the absence of an external power source will suffice in this context. Those skilled in the art will understand that the energy required to actuate the relays is needed only for a brief period.

Exemplary Power-Down and Power-Restore Routines:

In an exemplary embodiment, a control module in the meter head controls the power-down and power-restore routines, and relevant data is stored in FLASH or other non-volatile memory. Those skilled in the art will appreciate that loss of power, followed by full restoration of power, has the potential to cause surges and excessive load on a substation network.

Figure 1:
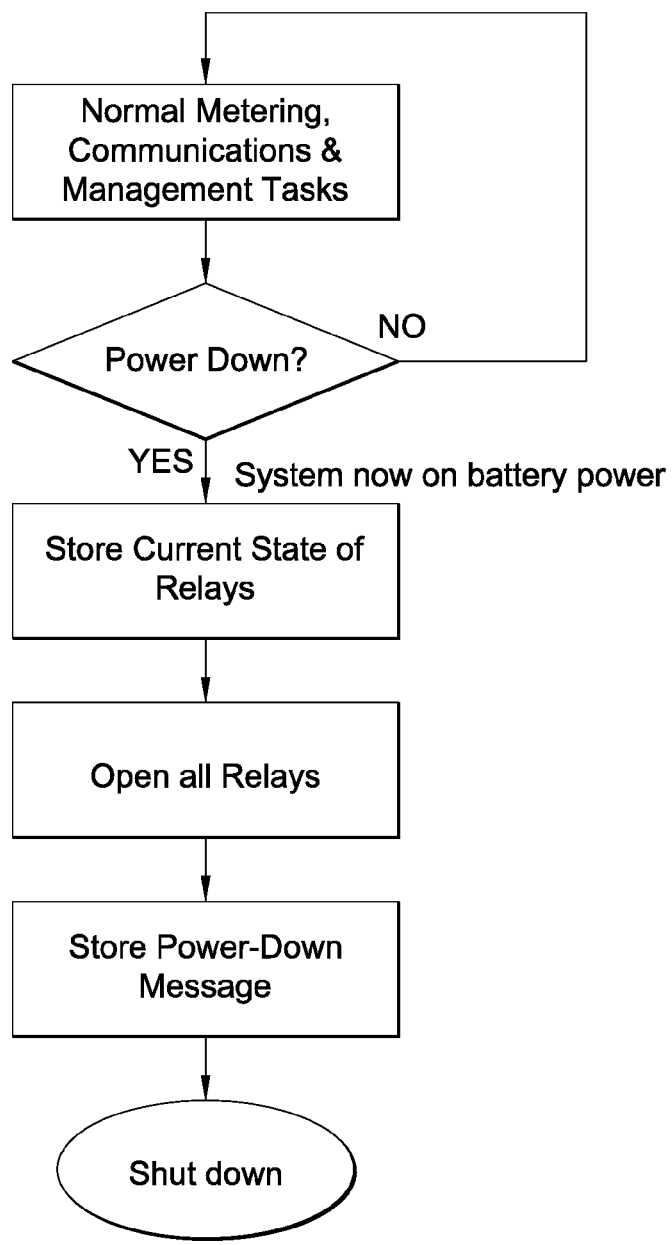
FIG. 1 depicts steps of an exemplary power-down routine.

As shown in the exemplary flowchart in FIG. 1, an exemplary embodiment comprises a power-down routine that stores the current status of the relays (and optionally, the current load on each consumer line) and opens all (or selected) relays after a loss of power. As will be understood by those skilled in the art, the relay status information may already have been stored in non-volatile memory.

Figure 2:
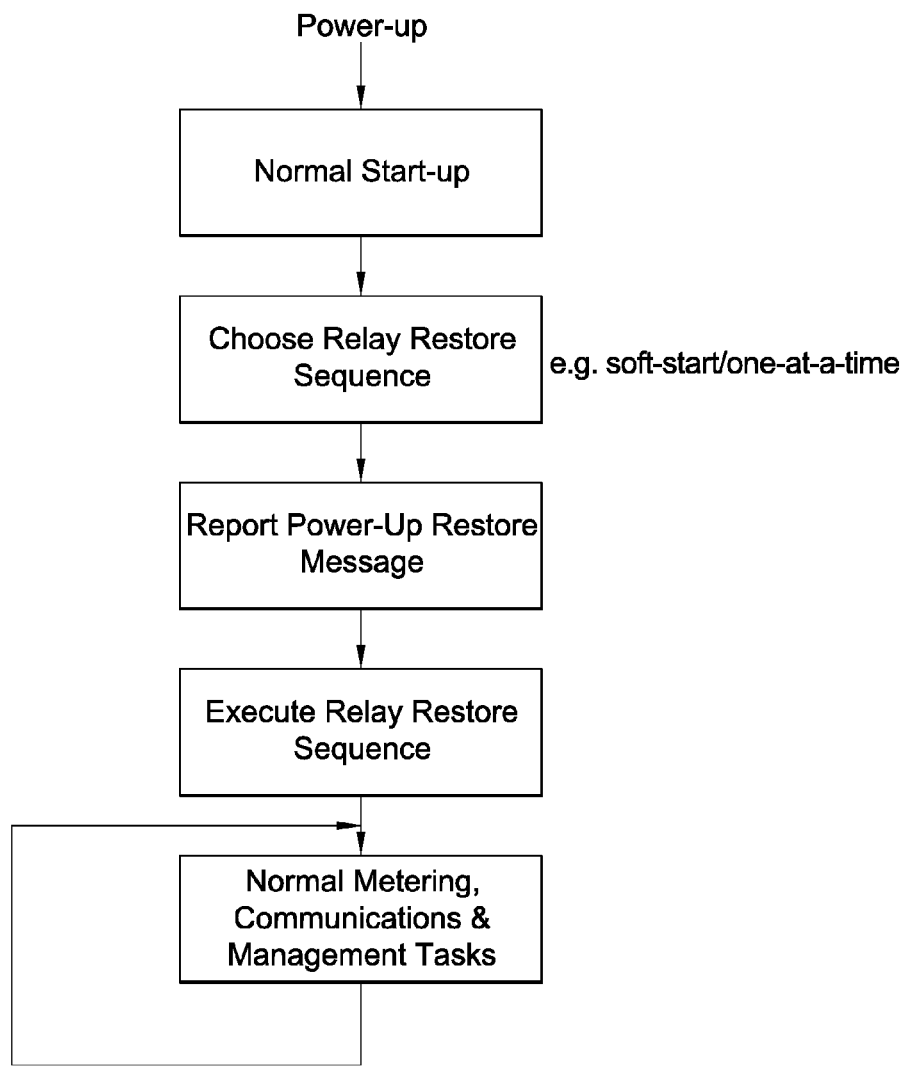
FIG. 2 depicts steps of an exemplary power-restore routine.
Figure 3:
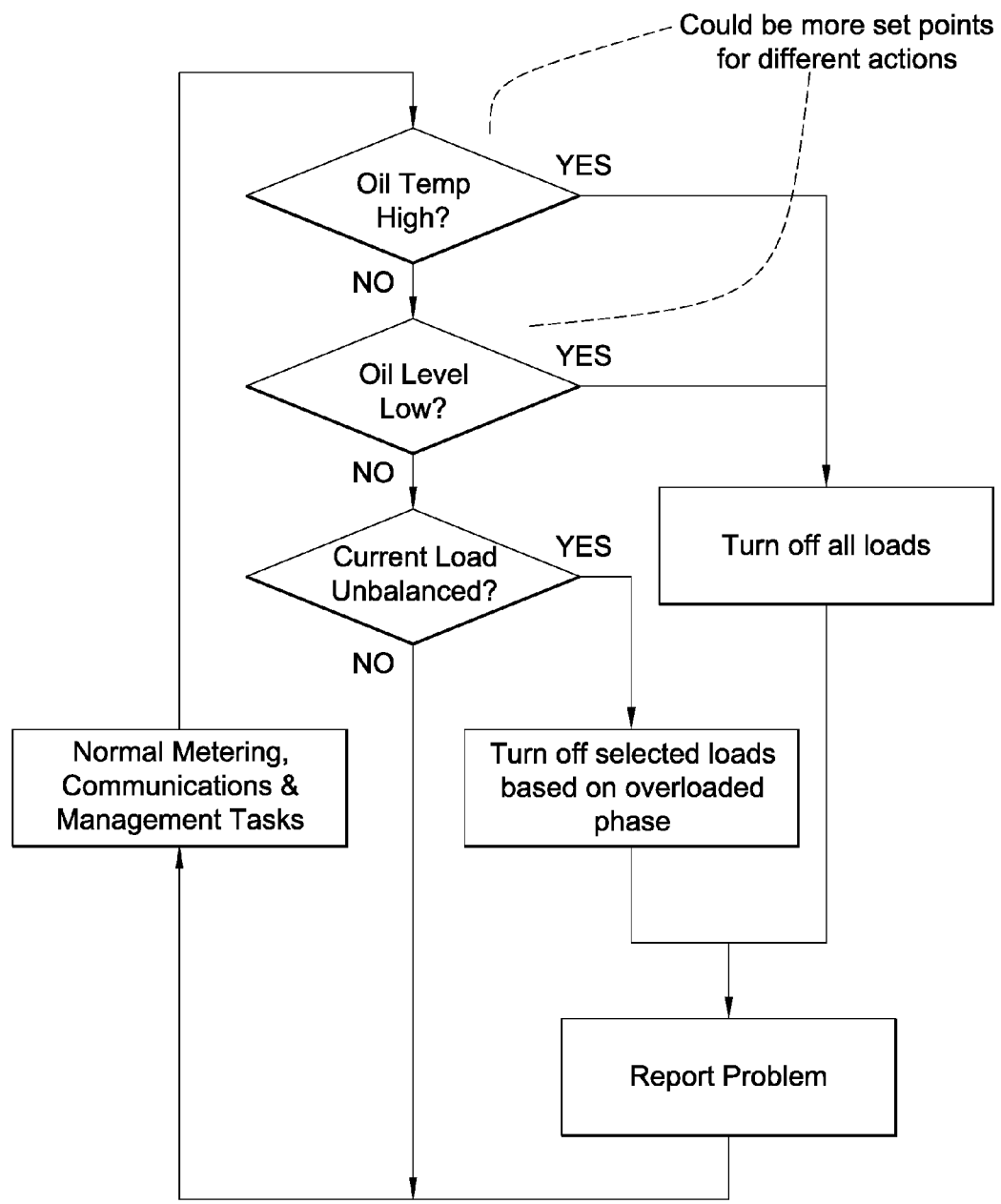
FIG. 3 depicts steps of an exemplary transformer condition monitoring.

As shown in the exemplary flowchart in FIG. 2, an exemplary embodiment comprises a power-restore routine that restores power to each consumer line after power to the transformer is restored. Since all (or selected) relays were opened after the loss of power, relays can be closed in an orderly sequential manner in order, for example, to avoid surges and excessive load on the substation network. Exemplary sequences include but are not limited to: order in which relays were opened, order of power consumption at time of power loss, and pre-determined priority.

Exemplary Cabinet/Transformer Integration:

Certain previous Energy Guard type implementations had external wires connecting the metering cabinet to the transformer. While such wires generally were kept as short as feasible, and the metering cabinets were high on the pole and near the transformer, they remained vulnerable to theft/tampering.

Figure 12:
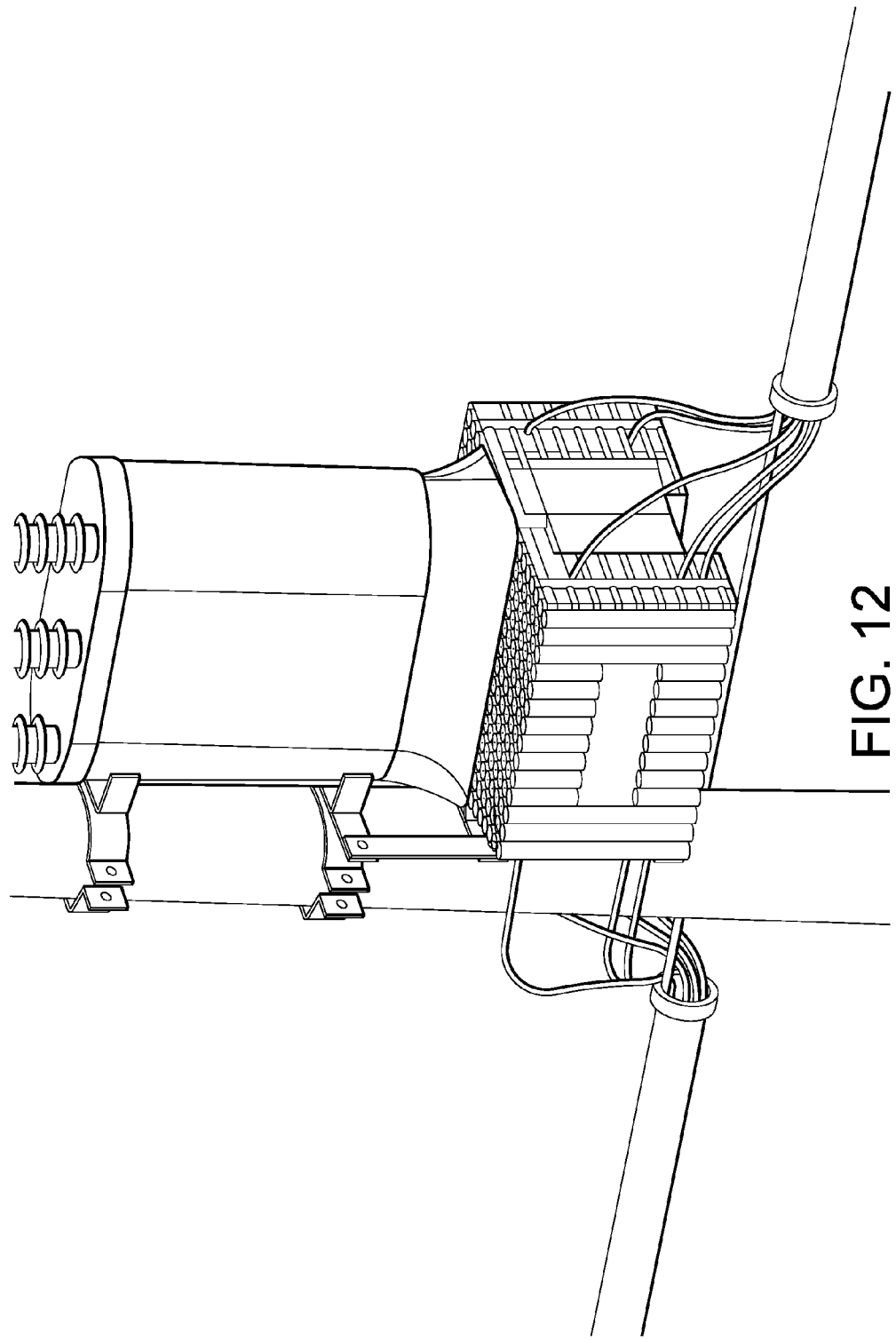
FIG. 12 depicts an exemplary style of attachment with an Energy Guard or similar system below transformer.

One or more exemplary embodiments comprise integrated housings that contain both a metering cabinet and a transformer housing ("can"). FIGS. 4-13 depict exemplary implementations of meter cabinet/transformer can integration. Note that while many of the implementations have the metering cabinet on the side of the transformer housing, other embodiments comprise different configurations. For example, FIG. 12 depicts an implementation with the metering cabinet on the bottom of the transformer housing.

In one or more exemplary embodiments, the metering cabinet and transformer housing are welded or bolted together, or otherwise integrated; in other exemplary embodiments, the cabinet and housing are connected via a metal collar. In one or more exemplary embodiments, the collar is adaptable, in order to facilitate connection of the metering cabinet to transformer housings of a plurality of sizes, shapes, and/or configurations. Embodiments comprising integrated metering cabinets and transformer housings are generally applicable to new production, and embodiments with a collar are generally applicable to retrofitting metering cabinets to pre-existing transformer housings.

Figure 4:
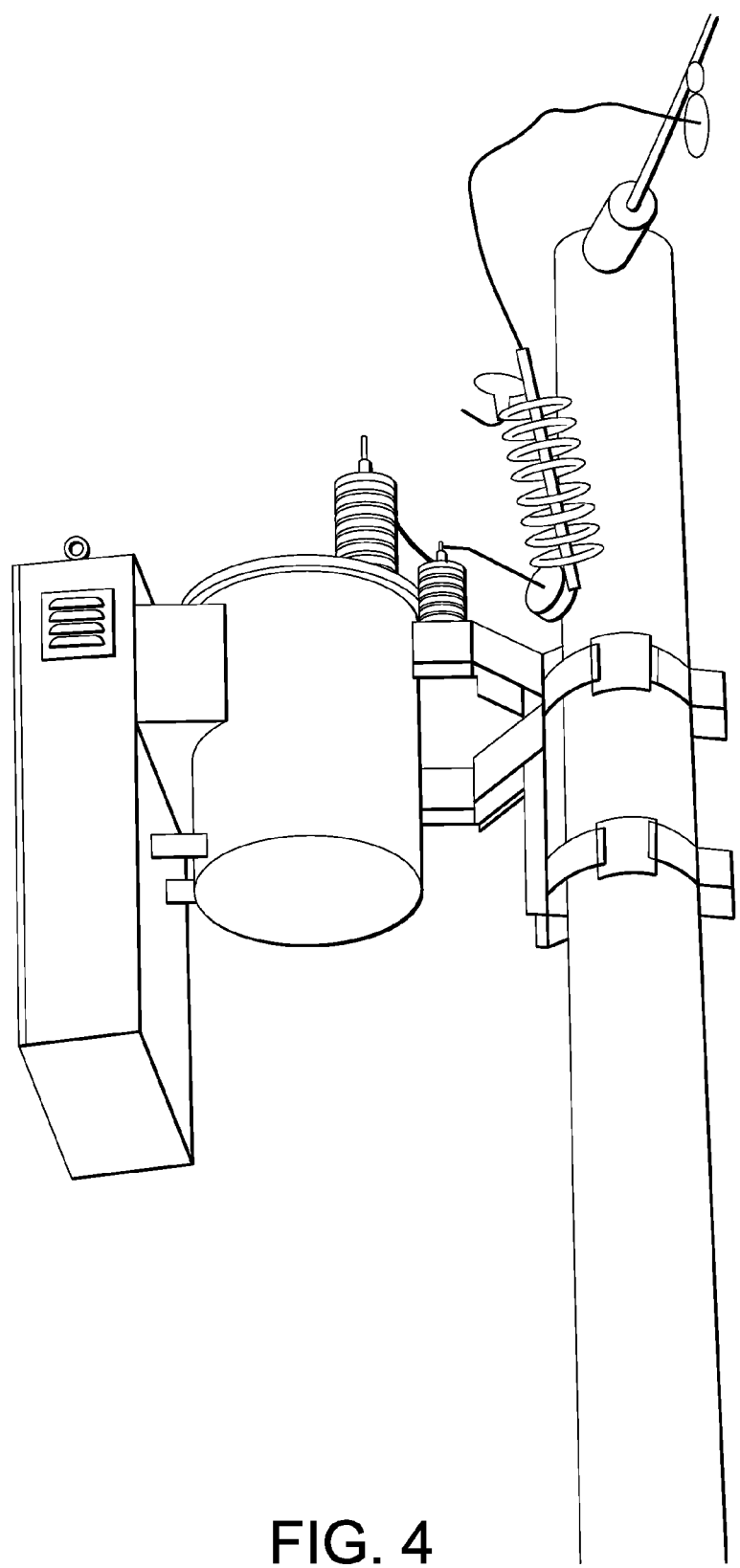
FIGS. 4, 5, and 8 depict exemplary views of utility poles with an Energy Guard rectangular electronics box attached directly to the round transformer.
Figure 5:
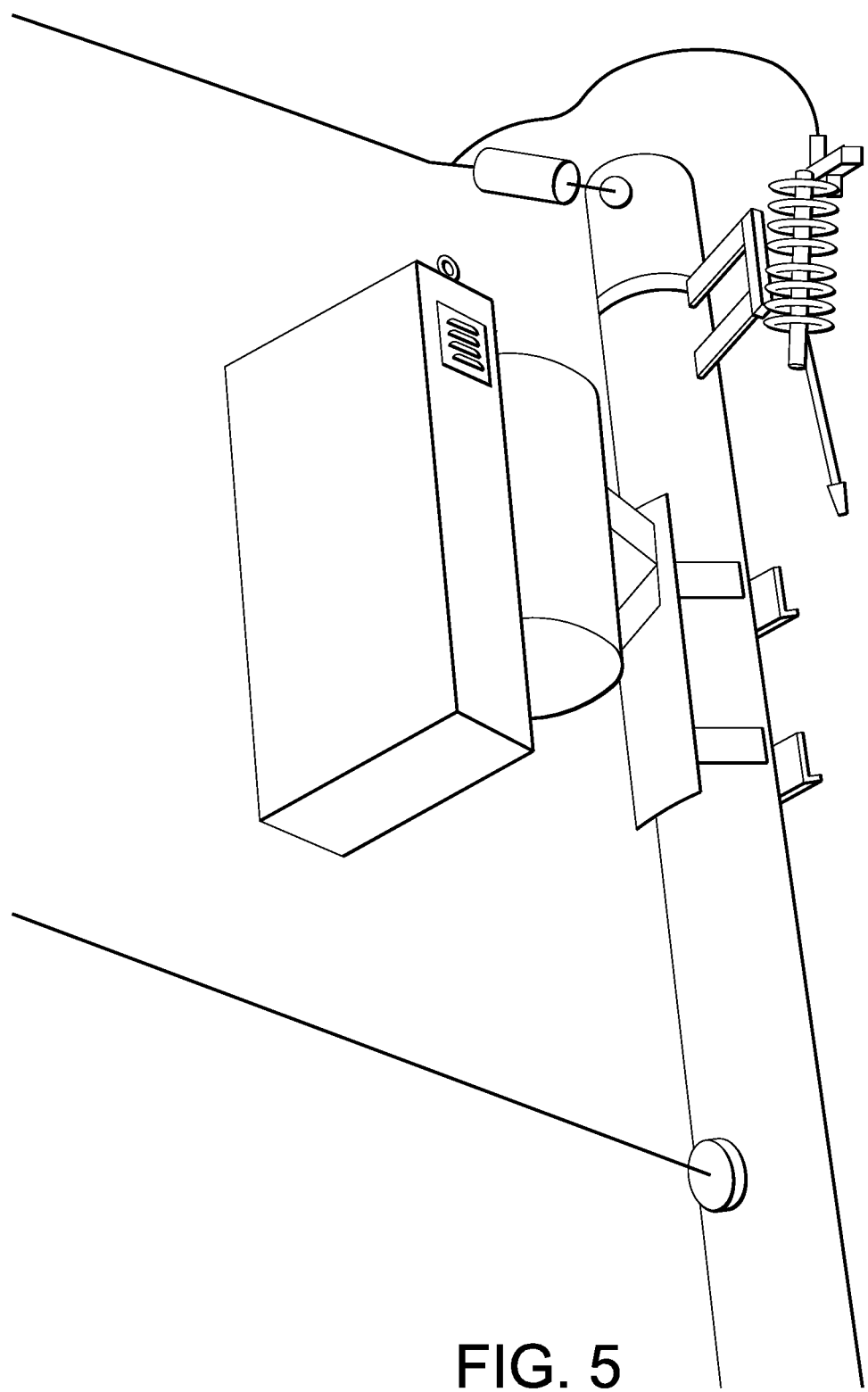
Figure 8:
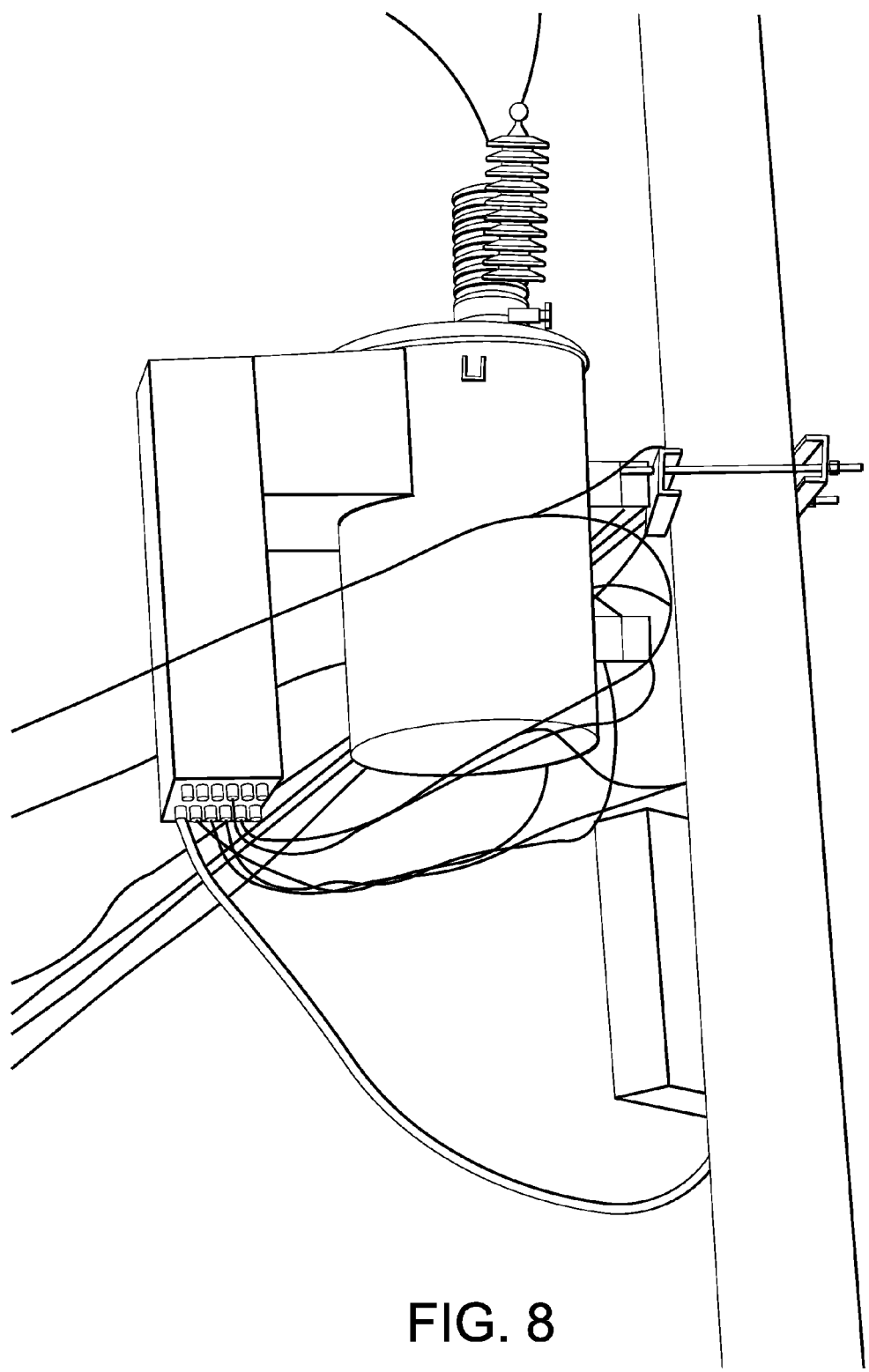

Specifically:

FIGS. 4, 5, and 8 depict exemplary views of utility poles with an Energy Guard rectangular electronics box attached directly to the round transformer with connecting rectangular access protecting low voltage from tampering.

Figure 6:
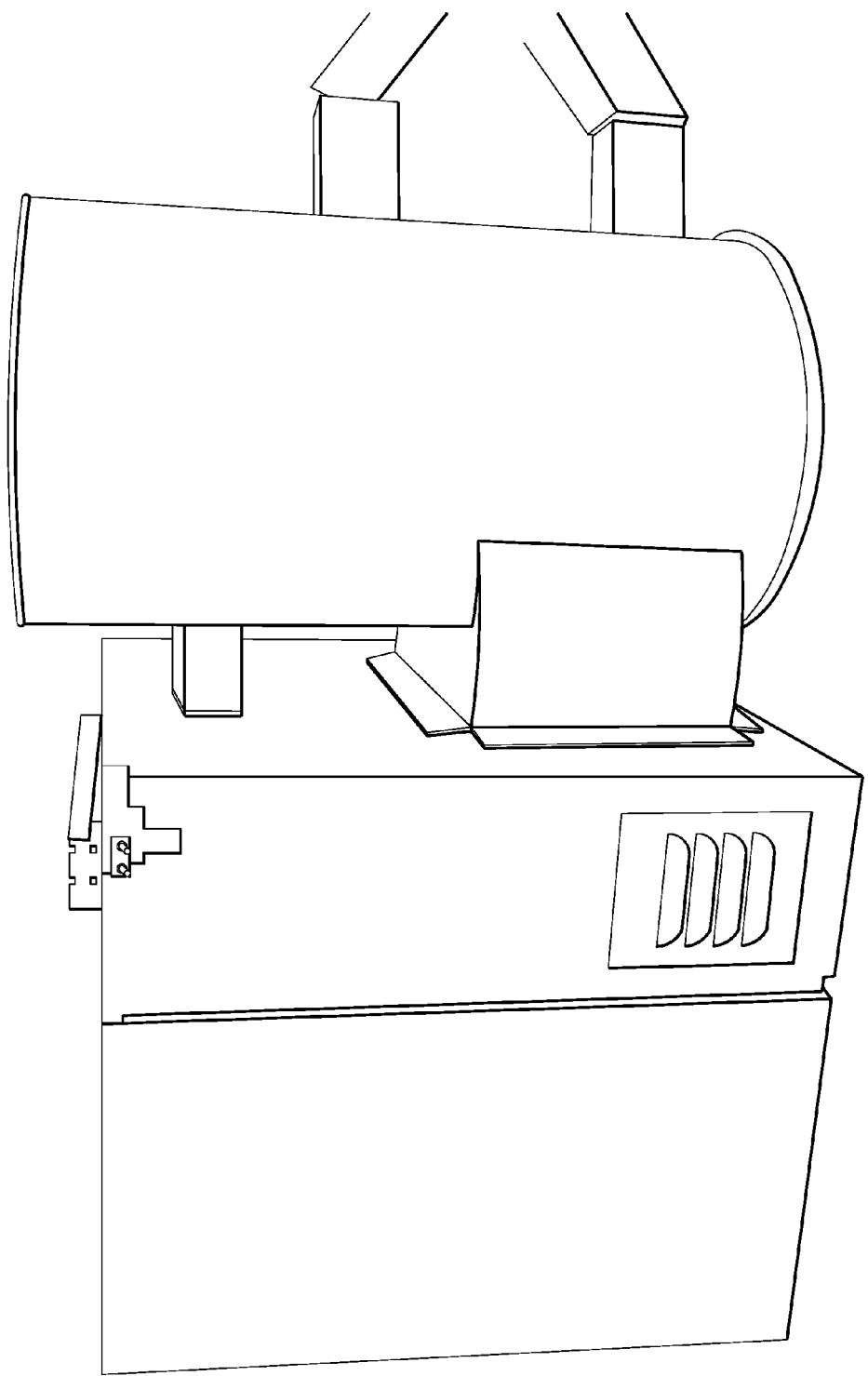
FIG. 6 depicts an exemplary close-up view of a similar assembly unmounted.

FIG. 6 depicts an exemplary close-up view of a similar assembly unmounted.

Figure 7:
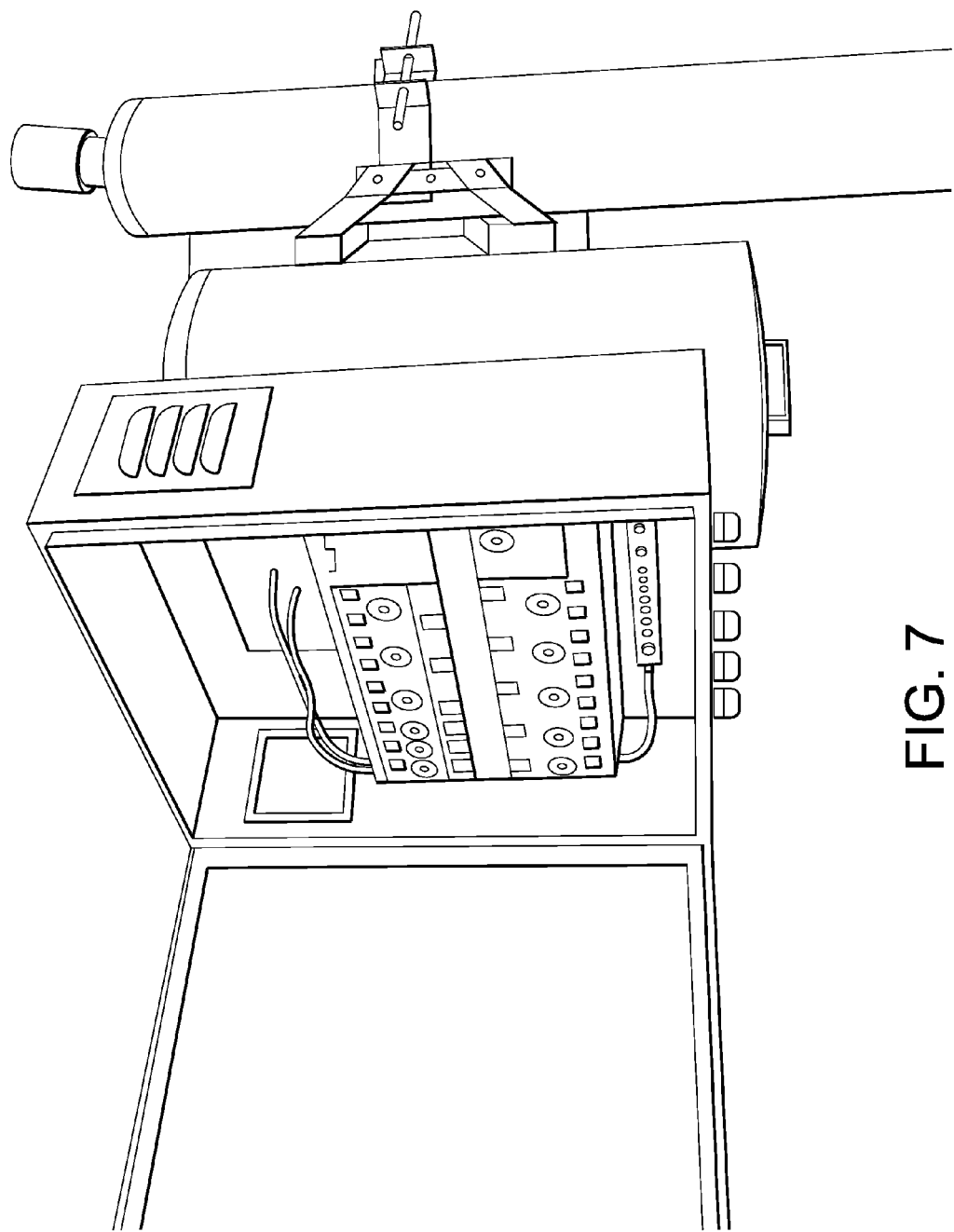
FIGS. 7 and 13 depict exemplary views of a similar assembly with an access door open.
Figure 13:
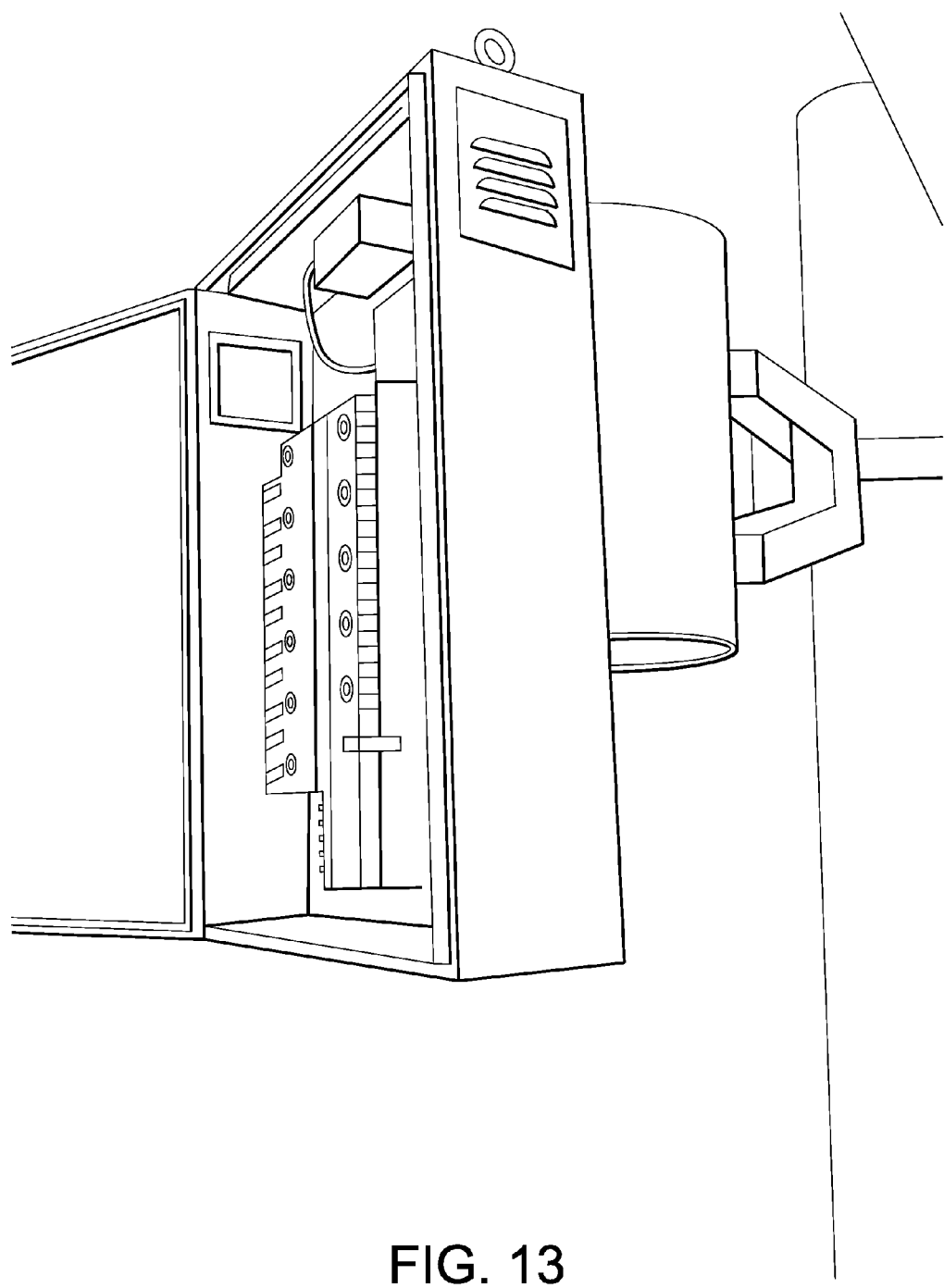

FIGS. 7 and 13 depict exemplary views of a similar assembly with an access door open, revealing an Energy Guard panel inside, including meter modules and control modules.

Figure 9A:
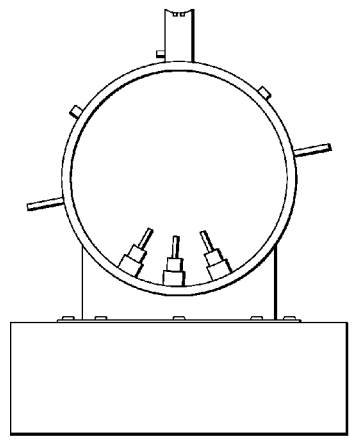
FIGS. 9A-9C depict an exemplary mechanical drawings of a similar assembly.
Figure 9B:
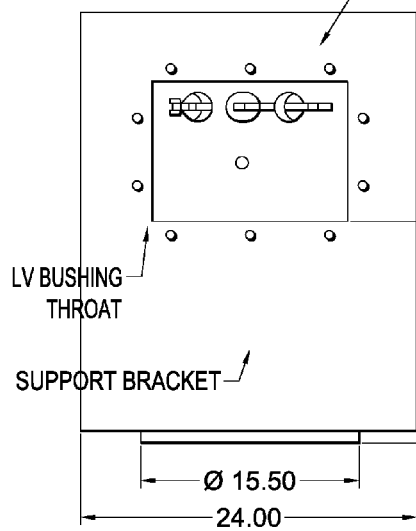
Figure 9C:
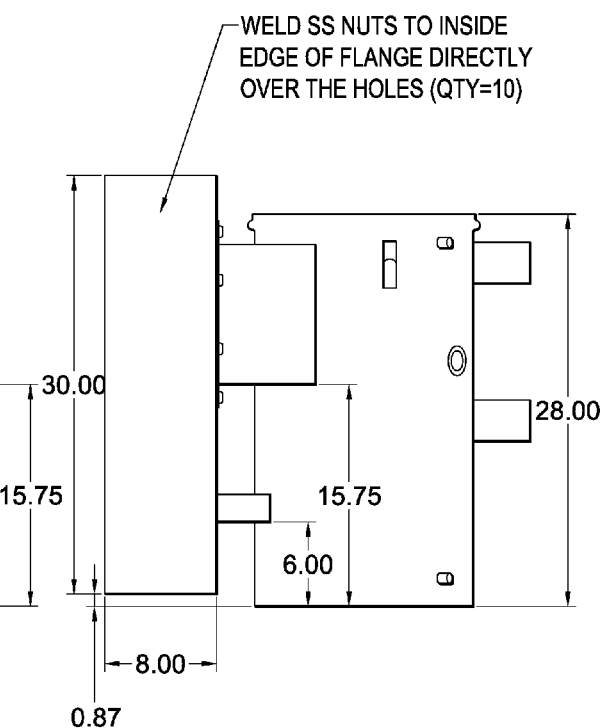

FIGS. 9A-9C depict an exemplary mechanical drawings of a similar assembly.

Figure 10:
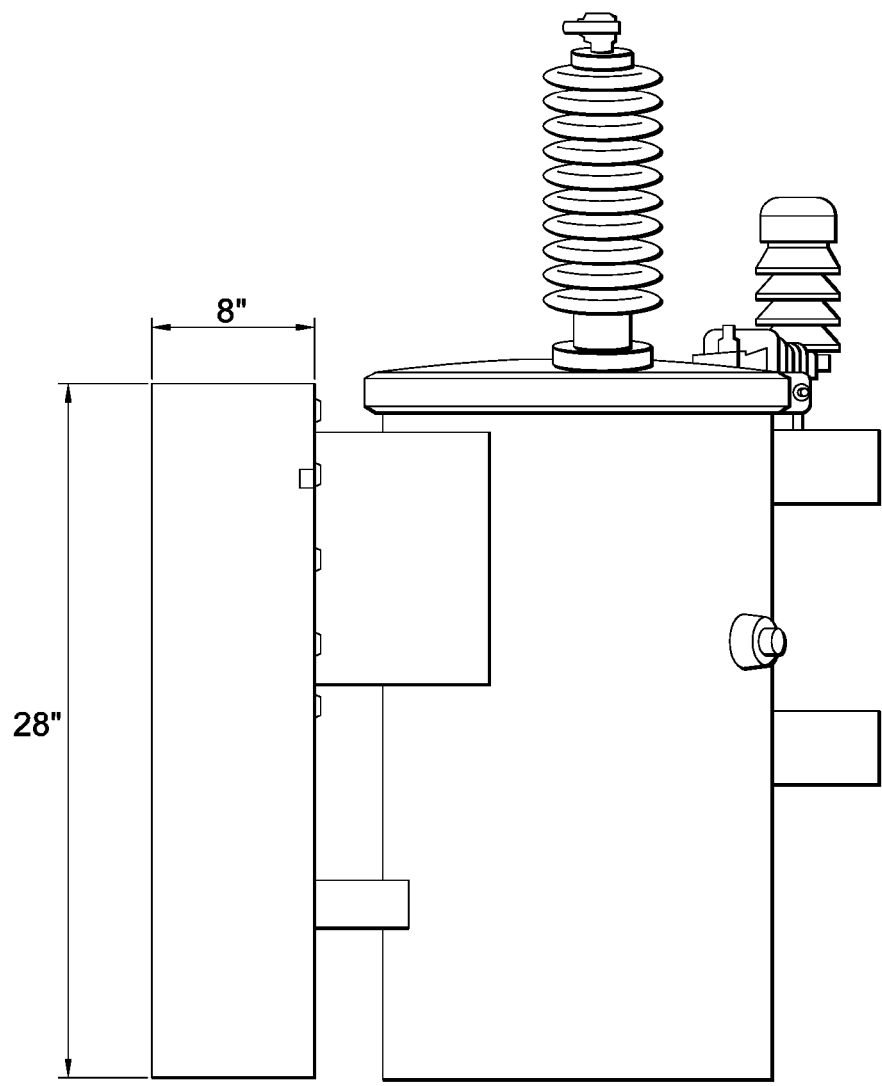
FIG. 10 depicts an exemplary attachment of a transformer to an Energy Guard cabinet.
Figure 11D:
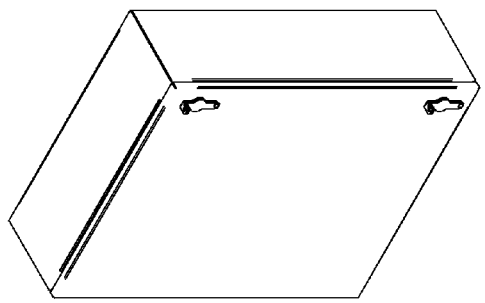
Figure 11E:
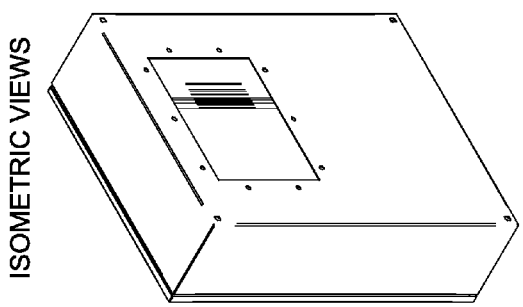
Figure 11C:
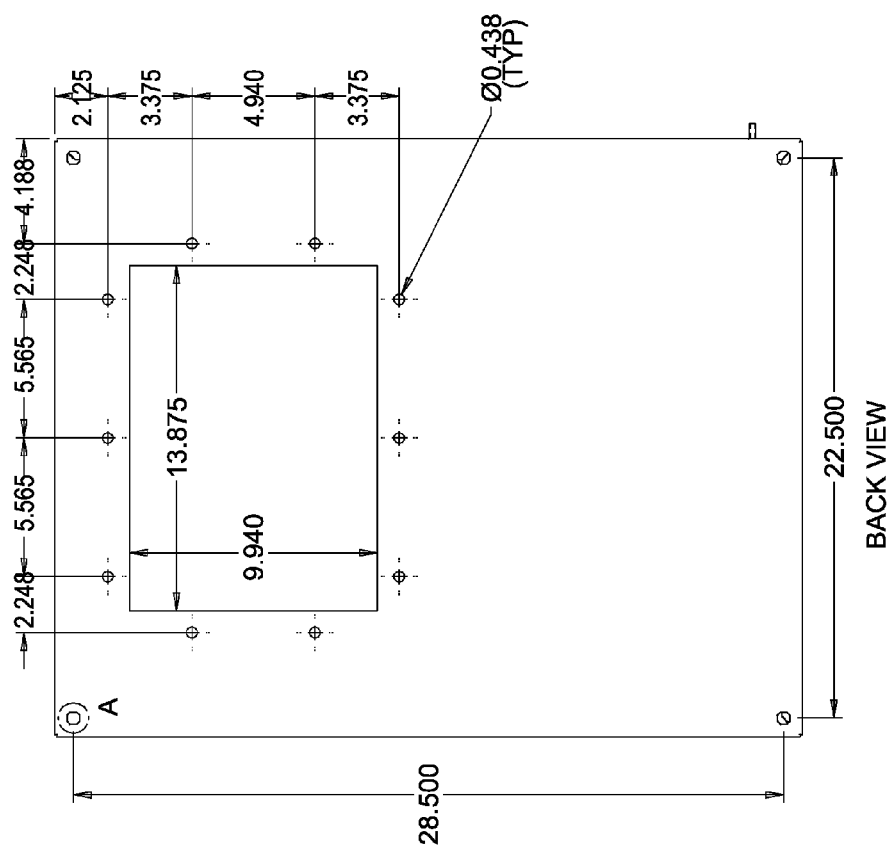
Figure 11F:
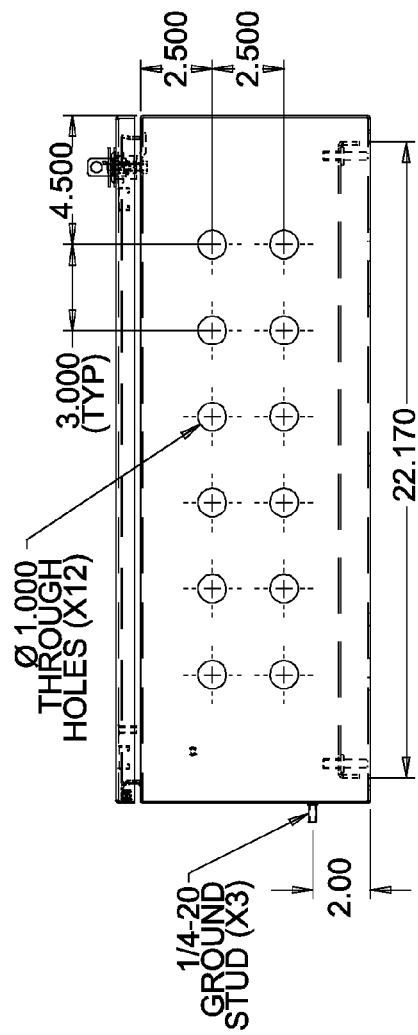
Figure 11G:
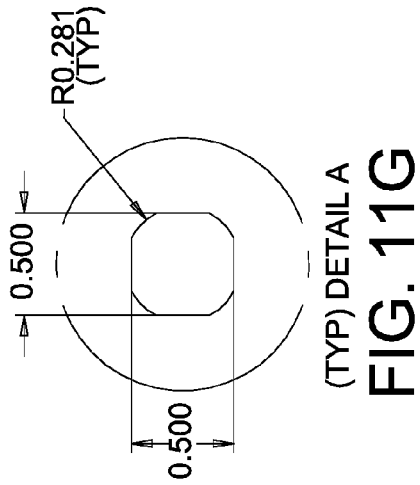

FIG. 10 depicts an exemplary attachment of a transformer to an Energy Guard cabinet.

FIG. 11A-11G depict exemplary mechanical drawings of an Energy Guard rectangular cabinet with rear access for attachment to a transformer.

FIG. 12 depicts an exemplary style of attachment to a South American-style transformer with an Energy Guard or similar system below transformer.

Exemplary transformer monitoring: One or more exemplary embodiments comprise means (e.g., temperature and oil level sensors, and related software) for detecting overheating and/or low oil levels in the transformer, and preferably means for autonomously reacting to such conditions. In these exemplary embodiments, an Energy Guard type device is in communication with an oil temperature sensor (examples of such sensors may be found at Dakota Digital: www.dakotadigital.com/index.cfm?ptype=product&product_id=113&category_id=311& home_id=59&mode=prod&prd113.htm (see, e.g., SEN-04-3)) and/or an oil level sensor (see, for example, UK based Gill Sensors—http://www.gillsensors.co.uk/content/oil_level_sensors.html and Aircraft Extras—http://www.aircraftextras.com/PDF-files/LOLS-InfoShtB.pdf); see also Exhibit 3 of U.S. Provisional Application No. 61/495,437.

When an unacceptable oil temperature or an unacceptable oil level is detected (thresholds for unacceptability will, as will be understood by those skilled in the art, depend on the type of transformer used, and the conditions under which it is used), the Energy Guard type device may selectively reduce or discontinue the power consumed by individual consumer lines, or discontinue all power consumed. If the unacceptable condition ends, the device may (gradually) restore power being consumed to previous levels, or to intermediate levels calculated to be acceptable.

Those skilled in the art will appreciate that measuring oil temperature is only one example of transformer temperature measurement. When, for example, a transformer does not use oil, the temperature of one or more internal components, or of the transformer housing, may be measured. Those skilled in the art will further understand that other environmental conditions of a transformer may be measured and/or acted upon without departing from the scope of these aspects of the invention.

Moreover the metering device may report oil and temperature status, and any actions taken in relation thereto, over the power lines to the utility or an intermediate location/device (e.g., a scan transponder). The metering device may also, instead of taking direct action, report temperature and/or oil level data over the power lines, and await instructions in response thereto.

While certain exemplary embodiments are described herein, it should be understood that those embodiments are presented by way of example only, and not limitation. While the embodiments have been particularly shown and described, it will be understood that various changes in form and details may be made. Although various embodiments have been described as having particular features and/or combinations of components, other embodiments are possible having a combination of any features and/or components from any of embodiments as discussed above.

We claim:

1. A remotely readable apparatus for metering of a plurality of electricity consumer lines, comprising:
   a meter head enclosed with a first housing, said meter head comprising one or more metering points, wherein said meter head measures electricity usage for each of the plurality of electricity consumer lines; and
   one or more sensors that sense environmental conditions in a second housing enclosing a distribution transformer that steps down voltage from a distribution level to a consumer level, said one or more sensors in electrical communication with said meter head and wherein said sensors are not operable to sense environmental conditions in said first housing, and wherein said meter head is operable to connect and disconnect service on one or more of said plurality of electricity consumer lines in response to information received from said one or more sensors, without affecting voltage supplied to said distribution transformer;
   wherein a transponder is in communication with said meter head and transmits data received from said meter head to a remotely located computer, and transmits to said meter head data received from said remotely located computer,
   wherein said meter head transmits to said transponder data based on said data received from said one or more sensors,
   wherein said meter head is operable, based on data received from said transponder and responsive to said data based on said data received from said one or more sensors, to connect and disconnect service on said electricity consumer lines, and
   wherein said meter head is operable to connect and disconnect service on each one of said plurality of electricity consumer lines in a rotating disconnect/connect sequence, and intermittent power is provided on each of said electricity consumer lines.

2. An apparatus as in claim 1, wherein said one or more sensors comprise a temperature sensor that measures a temperature of said distribution transformer, and said meter head is in electrical communication with said temperature sensor.

3. An apparatus as in claim 1, wherein said one or more sensors comprise an oil-level sensor that measures level of oil in said distribution transformer, and said meter head is in electrical communication with said oil-level sensor.

4. An apparatus as in claim 1, wherein said meter head is operable, in response to an interruption in flow of electricity being received from a distribution transformer, to disconnect service on one or more of said electricity consumer lines.

5. An apparatus as in claim 4, wherein service is disconnected via actuation of corresponding relays, and power to actuate said corresponding relays is stored in and received from a battery back-up system.

6. An apparatus as in claim 4, wherein service is disconnected via actuation of corresponding relays, and power to actuate said corresponding relays is stored in and received from a capacitive storage system.

7. An apparatus as in claim 4, wherein said meter head is operable, in response to restoration of electricity being received from a distribution transformer, re-connect service on said electricity consumer lines.

8. An apparatus as in claim 4, wherein said meter head is operable to store data reflecting, for each relay, a state existing immediately prior to interruption of electricity flow, and wherein said meter head is operable to actuate corresponding relays to re-connect service on said electricity consumer lines so as to restore each of said relays to said state existing immediately prior to interruption of electricity flow.

9. An apparatus as in claim 4, wherein, in response to restoration of electricity being received from a distribution transformer, said meter head is operable to re-connect service on said electricity consumer lines, said re-connection being in a sequence selected to minimize a surge or excessive load on a substation network.

10. An apparatus as in claim 1, wherein said transponder is in communication with said meter head via power line communication.

11. A method of metering a plurality of electricity consumer lines, comprising:
measuring, via a meter head in a first housing, electricity usage for each of the plurality of electricity consumer lines; and
sensing environmental conditions in a second housing enclosing a distribution transformer that steps down voltage from a distribution level to a consumer level, via one or more sensors in electrical communication with said meter head and wherein said sensors are not operable to sense environmental conditions in said first housing, wherein said meter head is operable to connect and disconnect service on one or more of said plurality of electricity consumer lines in response to information received from said one or more sensors, without affecting voltage supplied to said distribution transformer, and wherein said meter head is operable to connect and disconnect service on each one of said plurality of electricity consumer lines in a rotating disconnect/connect sequence, and intermittent power is provided on each of said electricity consumer lines.

* * * * *